United States Patent [19]
McLaurin et al.

[11] 4,158,218
[45] Jun. 12, 1979

[54] CERAMIC CAPACITOR DEVICE

[75] Inventors: Eugene D. McLaurin, Mauldin; William E. Hucks, Simpsonville; Gordon R. Love, Greenville, all of S.C.

[73] Assignee: Union Carbide Corporation, New York, N.Y.

[21] Appl. No.: 834,300

[22] Filed: Sep. 19, 1977

[51] Int. Cl.² ............................................... H01G 1/14
[52] U.S. Cl. .................................... 361/308; 361/306; 361/310; 361/321
[58] Field of Search ............... 361/321, 310, 308, 306, 361/400, 404, 405, 408, 309

[56] References Cited

U.S. PATENT DOCUMENTS

| 1,611,183 | 12/1926 | Frasse | 361/308 X |
| 3,264,534 | 8/1966 | Murphy | 361/308 X |
| 3,345,622 | 10/1967 | Matsushita | 361/408 X |
| 3,585,333 | 6/1971 | Valle | 361/408 X |
| 3,766,451 | 10/1973 | Voda | 361/309 |
| 4,004,200 | 1/1977 | Johanson | 361/310 X |

OTHER PUBLICATIONS

IBM Tech. Disclosure Bulletin, vol. 10, No. 8, 1/68, p. 1248.

Primary Examiner—E. A. Goldberg
Attorney, Agent, or Firm—Frederick J. McCarthy, Jr.

[57] ABSTRACT

A ceramic capacitor having stress relieving silver-base metal foil terminal strips bonded to a ceramic chip by a silver-base fired on metallizing composition.

4 Claims, 6 Drawing Figures

CERAMIC CAPACITOR DEVICE

The present invention is related to ceramic capacitors. More particularly, the present invention is directed to a ceramic capacitor device having a terminal arrangement which minimizes the stresses developed in the ceramic capacitor device by thermal expansion due to temperature variations occurring during utilization of the capacitor.

Ceramic capacitors, i.e., monolithic ceramic chip capacitors are well known in the prior art; the making of a common type of multielectrode ceramic chip capacitor is described in U.S. Pat. No. 3,612,963—J. Piper et al.

Ceramic chip capacitors in cubic shape, or other rectangular form are provided with metallizations at opposite end portions and these end metallizations are commonly attached to a circuit board or other substrate by terminal lead attachments. In the course of attachment and in operational use, the capacitor device is subjected to wide temperature excursions, e.g., typically about 400° C., i.e., from about −55° C. to +345° C.

A ceramic chip capacitor is formed of predominantly barium titanate or other material which has a coefficient of thermal expansion (CTE) which is considerably different from that of the usual circuit board substrate materials, e.g., $Al_2O_3$ or fiberglass laminate. Consequently, attachment of a ceramic chip capacitor to such substrates will cause the ceramic chip to be subjected to substantial and varying stresses due to differential thermal expansion occurring during installation and use.

There have been previous efforts addressed to this problem such as the use of leads in the form of foil strips soldered to the end metallizations of a chip capacitor and the use, with porcelain capacitors, of pure silver bus bar lead connections applied during firing of the capacitor body to a ceramic. These techniques are not completely satisfactory and do not consistently provide thermal stress relief. Also, solder joints are low melting, and brittle intermetallics can form during extended use while the use of silver at the high temperatures required in maturing ceramic chip capacitors, i.e. based upon barium titanate, is not effective.

It is therefore an object of the present invention to provide a ceramic chip capacitor device having a lead terminal arrangement which minimizes stresses due to differential thermal expansion.

Other objects will be apparent from the following description and claims taken in conjunction with the drawing wherein FIGS. 1 and 2 illustrate steps in the assembly of a capacitor device in accordance with the present invention;

A ceramic capacitor device in accordance with the present invention comprises a ceramic chip having parallel opposed end surfaces, each end surface having a fired-on metallizing composition; a metal foil terminal strip bonded to each end surface solely by the fired-on metallizing composition, the metallizing composition having a metal constituent consisting essentially of at least 80% Ag and up to 20% noble metal and the metal foil terminal strips having a composition consisting essentially of at least 80% Ag and about 2 to 20% noble metal, each metal foil terminal strip having a first portion in close surface-to-surface contact and bonded to a respective end surface of the ceramic chip by the fired-on metallizing composition, an end portion remote from the ceramic chip and bent at substantially 90° with respect to the first portion, and an intermediate portion of predetermined length extending between the first portion and the end portion, the predetermined length being sufficient to permit elastic deformation of the intermediate portion during an ambient temperature excursion of 400° C. with the end portions fixed to a substrate having a TCE which is in the range of ±100% of the TCE of the ceramic chip, the elastic deformation being sufficient to relieve damaging stress on the end surfaces of the ceramic chip.

Figure 1:
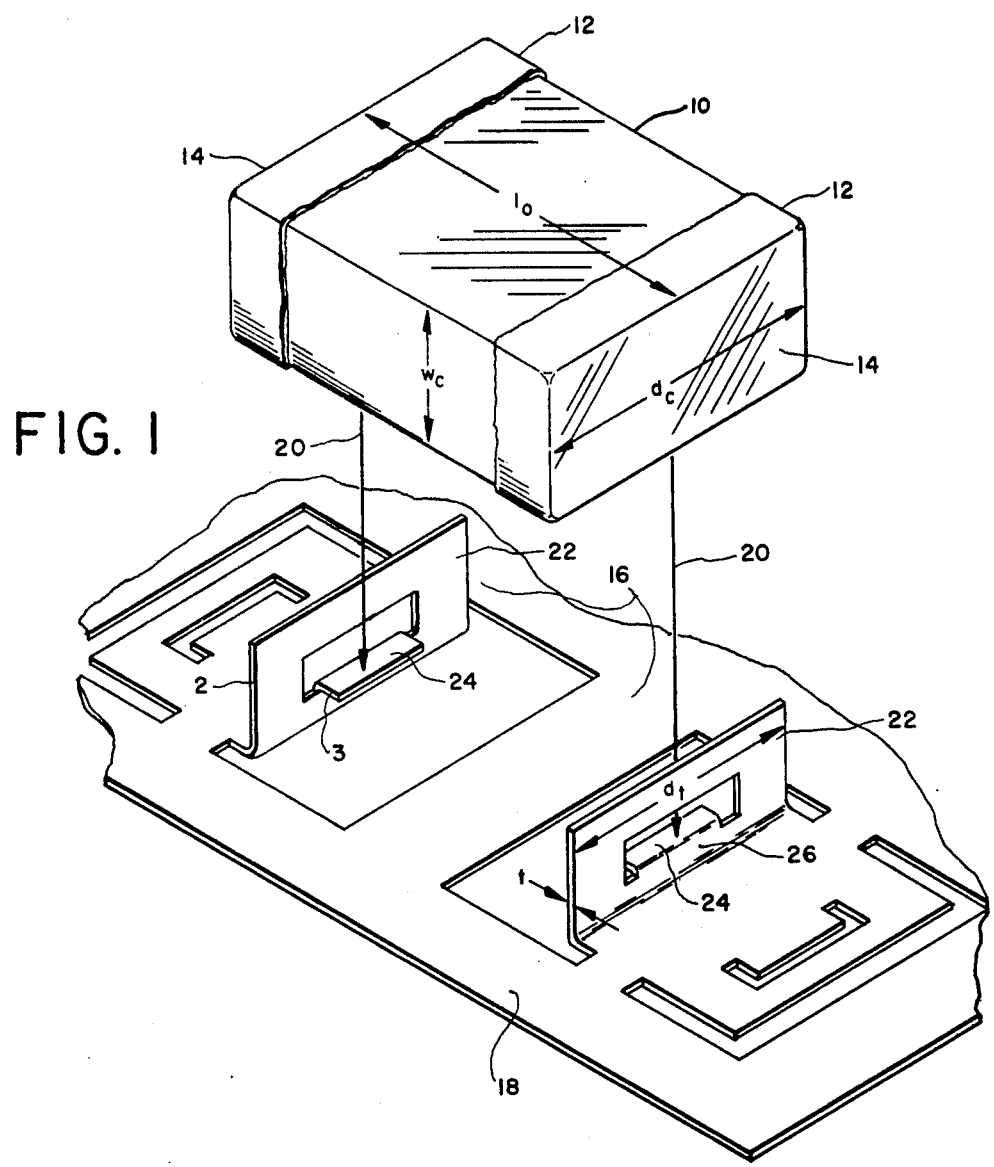

With reference to the drawing, FIG. 1 shows a conventional rectangularly shaped ceramic chip 10, e.g. predominantly barium titantate or predominantly a mixture of rare earth metal oxides with titania, having an unfired metallizing composition 12 containing finely divided particles of metal applied to the end portions of ceramic chip 10 including parallel opposed end surfaces 14 of ceramic chip 10. The metal constituent of metallizing composition 12 consists essentially of at least about 80% by weight Ag and up to 20% by weight of noble metal, e.g. palladium, platinum or gold; preferred metal compositions are pure silver, 97% Ag+3% Pt, 80% Ag+20% Pd. A preferred form of metallization 12 is a paste formed of a predominantly metal containing mixture of silver, palladium-silver or platinum-silver, glass frit and organics which, upon firing at about 850° C., provides a solid sintered metallization termination on a ceramic chip. A typical paste composition is 63 w/o Ag
7 w/o glass frit
20 w/o butyl cellusolve
10 w/o toluene.

Figure 3:
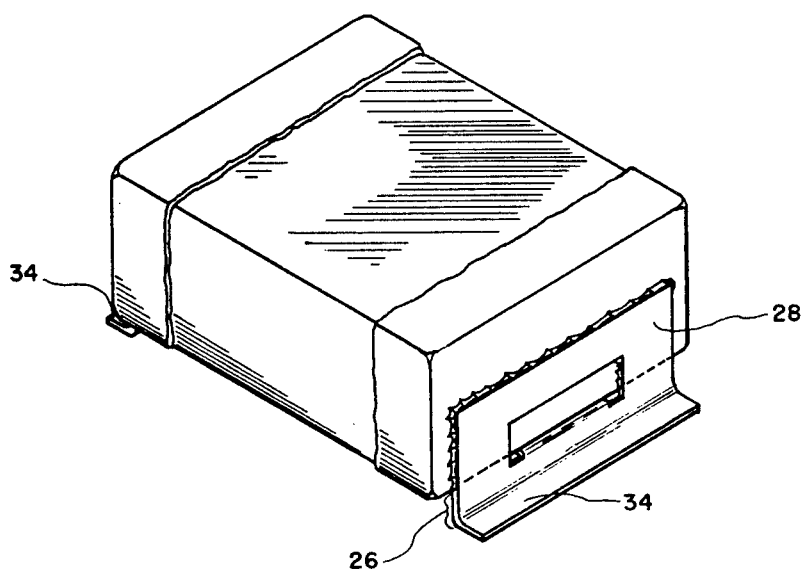
FIGS. 3 and 4 illustrate an embodiment of the present invention.
Figure 2:
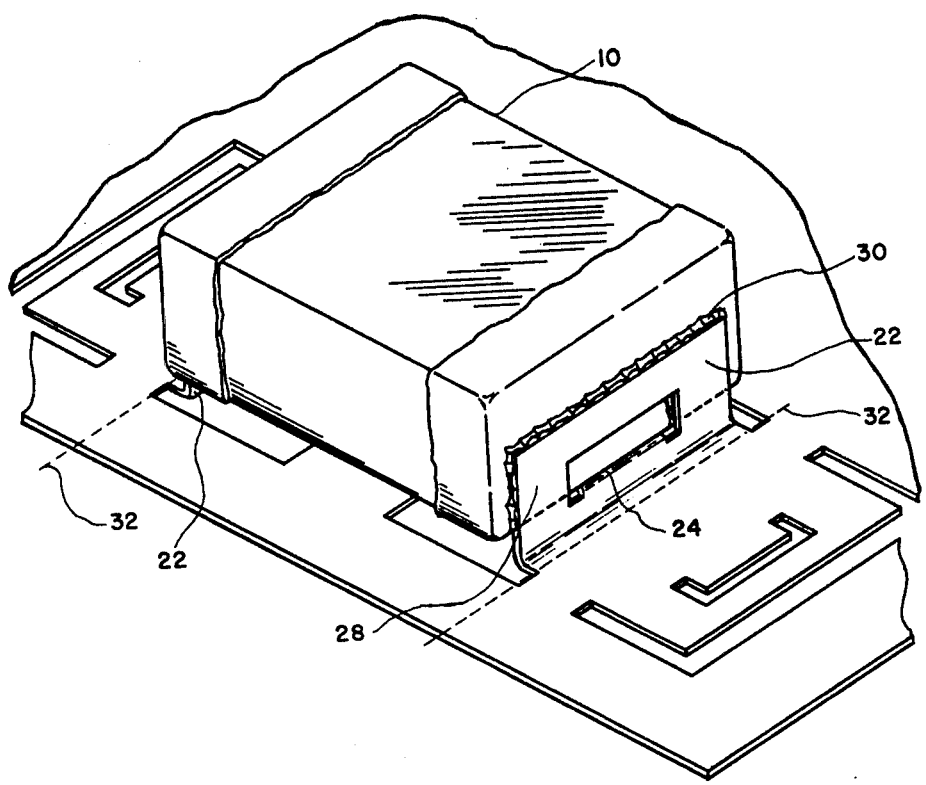
Figure 4:
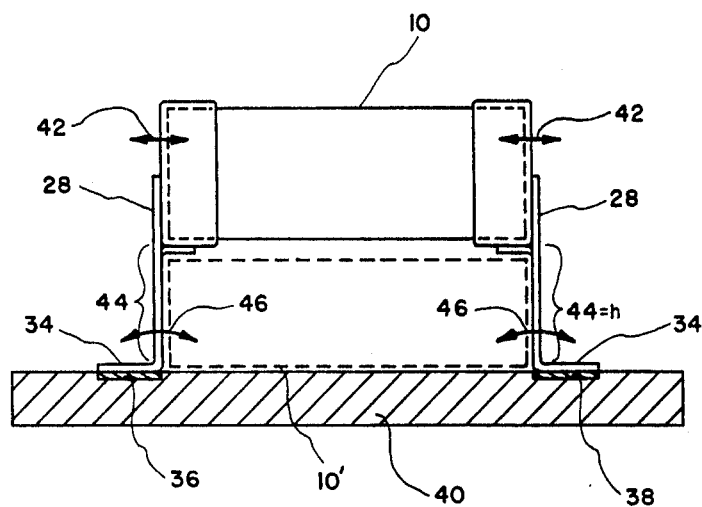

Ceramic chip 10 with unfired metallization paste 12 is positioned above a terminal lead configuration indicated generally at 16 in FIG. 1 which has been conventionally formed from a foil strip 18. Upon the lowering of chip 10 in the direction of arrows 20 the ceramic chip 10 is positioned as indicated in FIG. 2 with foil strips 22 closely contacting the unfired metallization 12 on opposed end faces 14. Chip 10 rests on horizontal tabs 24 which establish the predetermined length of intermediate portions 26 of strips 22. While positioned as in FIG. 2, the metallization 12, and the end surface contacting portions of strips 22 are conventionally subjected to a suitable metallization firing temperature, e.g. 750° C. to 850° C. for 10 minutes, and a solid, continuous, sintered metallization is formed which metallurgically bonds the end surface contacting portions 28 of foil strips 22 to chip 10 as indicated at 30. The strip 18 can now be cut along lines 32 to provide the capacitance device of the present invention illustrated in FIG. 3 having bent horizontal portions 34 which can be attached to suitable circuit board substrate as indicated in FIG. 4. With reference to FIG. 4, right angle bent strip portions 34 are conventionally affixed, e.g. by soldering to terminals 36, 38 of circuit board 40 which can be $Al_2O_3$, laminated fiberglass or other electrically insulative material suitable for such purpose. Upon being exposed to temperature excursions, ceramic chip 10 will undergo a thermal expansion different from that of substrate 40 in view of the known differences in CTE of barium titanate, $14 \times 10^{-6}/°$ C., and $Al_2O_3$ $7.8 \times 10^{-6}/°$ C., and fiberglass laminate $19 \times 10^{-6}/°$ C. This leads to substantial stress forces 42 on ceramic chip 10 through metal strips 22 and surface-to-surface contacting portions 28 and these stress forces can be determined by measurement or by known calculation techniques, e.g. as described by Allen et al in Thermal Expansion Compatibility of Ceramic Chip Capacitors Mounted on Alumina Substrates, Proc. ISHM, Oct. 30-Nov. 1, 1972 Washington, D.C. By way of example, a barium titanate ceramic chip rigidly attached to an $Al_2O_3$ substrate will be subjected to a stress of about 9-10,000 psi for a 100° C. temperature excursion which can be calculated as follows following the procedure of Allen et al:

$$\text{Stress} = Y \text{ capacitor } (CTE_{cap} - CTE_{substr}) \cdot \Delta T$$
$$= 16.10^6 (14 \times 10^{-6} - 7.8 \times 10^{-6}) 100 = 9900 \text{ psi}$$

This stress is in the range of the fracture stress of a barium titanate ceramic chip capacitor (9000-20,000 psi). Unless relieved, these forces can damage ceramic chip 10 leading to physical and electrical failure.

In the present invention these forces are relieved by providing an intermediate "tab" portion 44 of strips 22 with at least a predetermined minimum length which enables elastic deformation of strips 22 in the directions indicated at 46 upon differential thermal expansion of chip 10 and substrate 40 during temperature excursions of from about $-55°$ C. to $+345°$ C. The length of intermediate strip portion, i.e. tab 44, is selected also such that the forces 42 established at the end surfaces of ceramic chip 10 are not more than about 50% of the force that would be established if chip 10 were located such that intermediate tab portion 44 had a "0" length; i.e. chip 10 was rigidly secured to substrate 40 in a position in contact therewith as indicated at 10' in FIG. 4 without regard to the problem of differential thermal expansion. The theoretical basis for determining the appropriate length for intermediate tab portion 44 is described in a publication by the present applicants entitled, "Tab Lead Capacitor", IEEE Transactions on Parts, Hybrids, and Packaging, Vol. PHP-13, No. 3, September, 1977, which is incorporated herein by reference.

Figure 5:
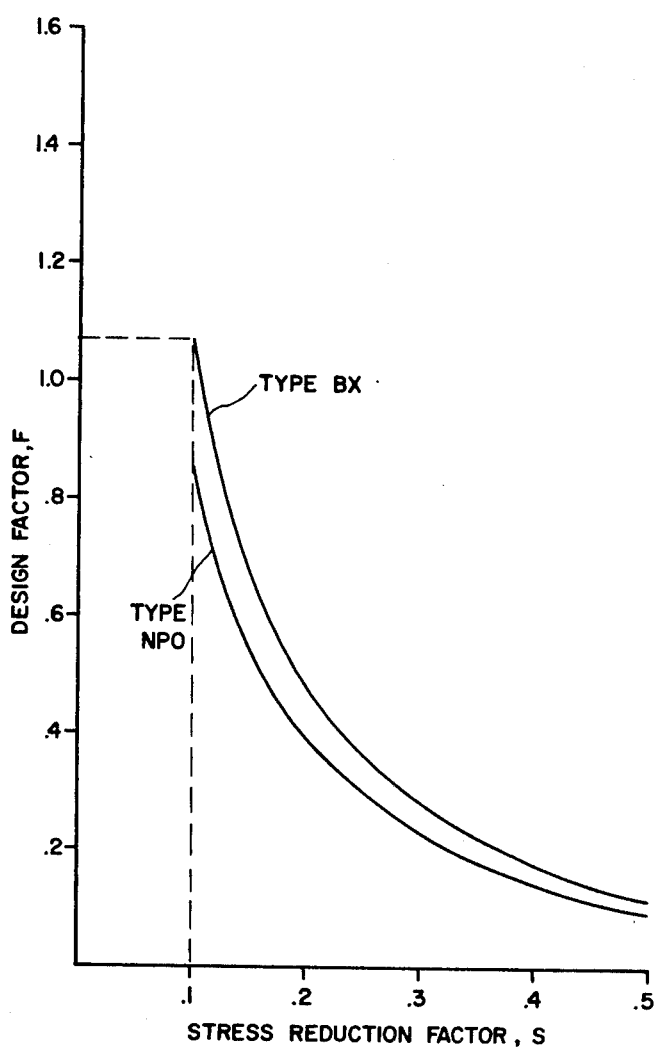
FIGS. 5 and 6 are graphs illustrating dimensional and design relationships in accordance with the present invention.

The following procedure illustrates the design of a tab 44 for a chip capacitor of arbitrary size. First, determine the stress which would occur in a rigidly attached chip capacitor and the stress reduction factor, S, desired. The stress reduction factor, S, is the ratio of actual stress 42 permitted in the tab-leaded capacitor to the stress induced in a chip capacitor of identical size rigidly attached to a substrate. A factor $S = 0.5$, corresponding to a 50% reduction in induced stress, e.g. from 9000 psi to 4500 psi in the case of a barium titanate chip, is usually sufficient to make catastrophic failure very unlikely, but a factor as low as $S = 0.1$, corresponding to a 90% reduction in induced stress, might be selected for unusually severe operational or assembly environments or to maximize margins for error. For any given dielectric type, a design factor, F, is given by a formula depending only upon the stress reduction factor, S, and the characteristic physical constants (Young's Modulus and Shear Modulus) of the dielectric and tab material which are either available or routinely determinable:

$$F = \frac{G}{2Y} \left( \frac{1}{S} - 1 \right)$$

where
$G^* =$ the shear modulus of the tab material (intermediate strip 44)
$Y^{**} =$ Youngs Modulus for the ceramic chip. Although the procedure is general and may be used on any chip capacitor device, not all the physical properties data are available for all dielectrics. In FIG. 5, the relationship between the design factor, F, and the stress relief factor, S, using the above formula, is shown for those dielectrics for which physical constant data are readily available using silver as the tab material as described in, "Tab Lead Capacitor" op. cit. The curve labeled "BX" ($CTE = 14 \times 10^{-6}/°$ C.) is representative of a predominantly barium titanate formulation as described for example in U.S. Pat. No. 3,987,347 and the curve labeled "NPO" ($CTE = 14 \times 10^{-6}/°$ C.) is representative of a formulation based upon mixtures of rare earth oxides and titania, such as Tamtron 5038, by NL Industries, Inc. Thus, using the above formula, or the graphs of FIG. 5, the appropriate design factor for tab 44 can be determined. With this value of design factor, F, for tab 44, and by selecting an appropriate thickness for the tab 44, the length, h, of tab 44 can be found using the following formula:

$$h = \frac{F \times l_0 \times d_t}{(w_c d_c) t}$$

where
$h =$ the length of tab 44
$F =$ design factor (see formula above)
$l_0 =$ length of ceramic chip
$d_t =$ width of tab 44
$w_c =$ thickness of ceramic chip
$d_c =$ width of ceramic chip
$t =$ thickness of tab 44

Figure 6:
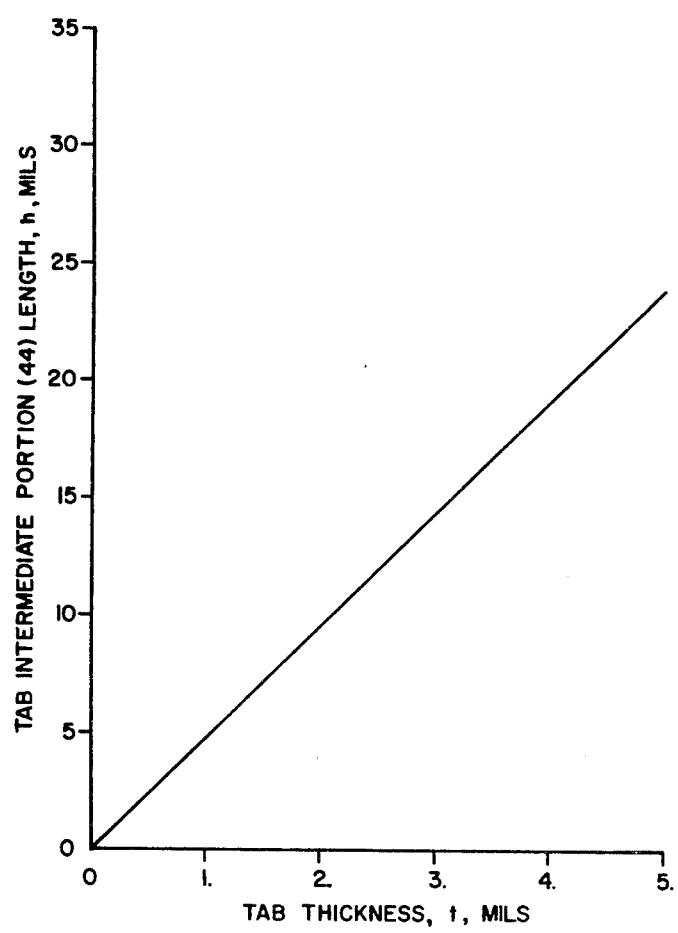

The foregoing formula is plotted as a graph in FIG. 6 form which the length of tab 44 can be determined directly for a given thickness for tab 44.

*$3.8 \times 10^6$ psi for Ag
**$16 \times 10^6$ psi for BX Chip capacitors; $20 \times 10^6$ psi for NPO chip capacitors The variables of chip length, width, and thickness are normally dictated by the desired capacitance value and voltage rating and, although known, cannot be adjusted by the designer of the tab lead. Similarly, for strength and electrical conductivity, it is desirable that the tab be wide. For space saving reasons, a convenient tab width is that equal to the chip width. Having accepted these constraints, the designer should select a tab intermediate portion length 44, h, (that portion of the tab which defines the vertical separation between the installed chip capacitor and the bonding substrate surface) which increases with tab thickness, t, as shown in FIG. 6.

The line shown for illustration describes the following design constraints: (1) A stress reduction factor of 0.1, corresponding to a 90% reduction in induced stress and hence, from FIG. 5, a design factor of 1.07 for a "BX" capacitor; (2) a chip capacitor measuring 0.225" in length from termination to termination, 0.245" in width transverse to the terminations and 0.050" in thickness (typical of a MIL-55681-designation CDR06BX474 capacitor chip); and (3) a silver-alloy tab as wide as the chip itself, 0.245". The graph of FIG. 6 (and the corresponding formula) indicates, for example, that, if the tab intermediate portion 44 is 0.003 inches thick, then the length, h, of that portion must be 0.0144 inches to achieve the design criteria.

For redesign to a different capacitor chip, the following relations apply:

(1) for each 10% increase in chip length, tab width or design factor, F, increase the slope of the straight line in FIG. 6 by 10%;

(2) for each 10% increase in chip width or chip thickness, decrease the slope of the line in FIG. 6 by 10%;

(3) similarly, if chip length, tab width or design factor decrease, then decrease the slope of the line FIG. 6 by 10% for each 10% decrease;

(4) finally, if chip width or thickness decrease, then increase the slope of the line in FIG. 6 by 10% for each 10% of decrease.

The ceramic chip device in accordance with the present invention has several important advantages. The elimination of damaging stresses of the ceramic chip as described above, in conjunction with a strong diffusion bond between the metallization at the end surfaces of the chip and the contacting lead strip portions which is established during sintering of the metallization powders; by using the compatible specified alloy composition for the lead strips and the specified metal constituents in the metal paste, sintering at a temperature of about 850° C. (750° C. to 900° C.) provides a sound common metal bond, e.g. Ag to Ag, Pt to Pt, which does not produce voids or intermetallics during service.

Other advantages of the device of the present invention are complete compatibility with existing practices for circuit assembly by solder-reflow. This results from the selection of the silver plus noble metal alloy for the tab. These alloys are known to be excellently solder-wettable and yet sufficiently resistant to scavenging, dissolution of the tab material into the molten solder during assembly, to yield joints of reproducible high integrity. Although brittle intermetallics may form in these joints, the tab length greatly attenuates the stresses upon the joints, and the tab shape assures that the stresses are in (nearly pure) shear. Since brittle compounds may be quite strong except in tension, shear stresses do not compromise the reliability of device in circuit. The shape of a tab leaded device lends itself to assembly techniques not now commonly used for chip capacitor attachment, such as beam-lead techniques, ultrasonic bonding, and the like. This might be of advantage for special cases.

What is claimed is:

1. A ceramic capacitor device comprising a ceramic chip of substantially rectangular cross-section having substantially rectangular parallel opposed end surfaces each end surface having a fired-on metallizing composition; a metal foil terminal strip metallurgically bonded to each end surface solely by said fired-on metallizing composition having a metal constituent consisting essentially of at least 80% Ag and up to 20% noble metal and said metal foil terminal strips having a composition consisting essentially of at least 80% Ag and about 2 to 20% noble metal, each metal foil terminal strip having an integral first portion in close surface to surface contact and metallurgically bonded to a respective end surface of said ceramic chip solely by said fired-on metallizing composition, an integral end portion remote from said ceramic chip and bent at substantially 90° with respect to said first portion, and an integral elastically deformable intermediate portion of predetermined length between said first portion and said end portion extending from said ceramic chip to said end portion and characterized by substantial elastic deformability with respect to forces acting at said end portions, said predetermined length being sufficient to permit elastic deformation of said intermediate portion during an ambient temperature excursion of 400° C. with each said end portion fixed in surface-to-surface contact to a substrate having a TCE which is in the range of ±100% of the TCE of the ceramic chip, said elastic deformation being sufficient to relieve damaging stress on the end surfaces of said ceramic chip.

2. A device in accordance with claim 1 wherein said intermediate portion of each said metal foil strip has a length which establishes a stress on the end surfaces of said capacitor chip which is not more than 10% of the stress that would be established for "0" intermediate portion length.

3. A device in accordance with claim 1 wherein the intermediate portion of each metal foil strip has an integral tab portion parallel to its end portion which contacts with said ceramic chip to establish the length of said intermediate portion.

4. A ceramic capacitor device comprising a ceramic chip having parallel opposed end surfaces each end surface having a fired-on metallizing composition; a metal foil terminal strip metallurgically bonded to each end surface solely by said fired-on metallizing composition having a metal constituent consisting essentially of at least 80% Ag and up to 20% noble metal and said metal foil terminal strips having a composition consisting essentially of at least 80% Ag and about 2 to 20% noble metal, each metal foil terminal strip having an integral first portion, in close surface to surface contact and metallurgically bonded to a respective end surface of said ceramic chip solely by said fired-on metallizing composition, an integral end portion remote from said ceramic chip and bent at substantially 90° with respect to said first portion, an integral elastically deformable intermediate portion of predetermined length between said first portion and said end portion extending from said ceramic chip to said end portion and characterized by substantial elastic deformability with respect to forces acting at said end portions, and an integral tab portion on each metal strip extending parallel to its end portion which contacts said ceramic chip to establish the length of said intermediate portion, said predetermined length being sufficient to permit elastic deformation of said intermediate portion during an ambient temperature excursion of 400° C. with each said end portion fixed in surface-to-surface contact to a substrate having a TCE which is in the range of ±100% of the TCE of the ceramic chip, and the predetermined length of said intermediate portion being defined as follows:

$$h \text{ (length of intermediate portion)} = \frac{F \times l_0 \times d_t}{(w_c d_c)t}$$

$$F = \frac{G}{2Y}\left(\frac{1}{S} - 1\right)$$

S = 0.1 to 0.5
$l_0$ = length of ceramic chip
$d_t$ = width of intermediate portion
$w_c$ = thickness of ceramic chip
$d_c$ = width of ceramic chip
t = thickness of intermediate portion
G = the shear moculus of the intermediate portion
Y = Youngs Modulus for the ceramic chip said elastic deformation being sufficient to relieve damaging stress on the end surfaces of said ceramic chip.

* * * * *